United States Patent [19]

Boldridge, Jr. et al.

[11] Patent Number: 4,712,092
[45] Date of Patent: Dec. 8, 1987

[54] PARALLEL ENCODED PIEZOELECTRIC KEYBOARD SWITCH AND ARRAY

[75] Inventors: Austin Boldridge, Jr., Freehold, N.J.; Scott Buell, Harpers Ferry, W. Va.; James M. Graham, Westminster, Md.

[73] Assignees: Aaron J. Gellman; Samuel H. Levinson, both of Glencoe, Ill.

[21] Appl. No.: 563,525

[22] Filed: Dec. 20, 1983

[51] Int. Cl.$^4$ .............................................. G06F 3/02
[52] U.S. Cl. ............................ 340/365 A; 340/365 R; 340/365 S
[58] Field of Search .......... 340/365 A, 365 C, 365 S, 340/365 R, 711, 712; 200/5 A

[56] References Cited

U.S. PATENT DOCUMENTS

| | | | |
|---|---|---|---|
| 3,696,408 | 10/1972 | Bouchard et al. | 340/365 A |
| 3,696,411 | 10/1972 | Kilby et al. | 340/365 A |
| 3,935,485 | 1/1976 | Yoshida et al. | 340/365 A |
| 3,940,637 | 2/1976 | Ohigashi et al. | 340/365 A |
| 3,976,899 | 8/1976 | Fanshawa | 340/365 A |
| 4,314,116 | 2/1982 | Gordon | 200/5 A |
| 4,318,087 | 3/1982 | Wilson | 340/365 S |
| 4,378,552 | 3/1983 | Jalbert | 340/365 A |
| 4,414,538 | 11/1983 | Schnizlein | 340/365 C |

OTHER PUBLICATIONS

Mathewson et al.—Momentary Contact Actuator—Mar. 1973—vol. 15, No. 10—pp. 3162-3163.

Primary Examiner—John W. Caldwell, Sr.
Assistant Examiner—Mahmoud Fatahiyar
Attorney, Agent, or Firm—Epstein & Edell

[57] ABSTRACT

A keyboard switch includes a plurality of spaced piezoelectric transducers secured to a common strike plate which is selectively impacted to actuate all of the transducers in response to switch actuation. The switch includes a snap action spring member carrying an impact member which impacts the strike plate as the spring member snaps to its actuated state when the switch is depressed. The spring member causes the impact member to maintain a compressive force against the strike plate, maintaining the transducers actuated while the key remains depressed and for a short interval after the key is released. An array of such switches on a keyboard is disposed over a plurality of parallel data lines which electrically contact one or more transducers at each switch in accordance with a switch indentification code. The parallel binary number appearing on the lines is received by processing circuitry which identifies each depressed key by its code. By maintaining compressive forces on the transducers, the system facilitates character processing and generation of certain specialized character functions.

25 Claims, 12 Drawing Figures

FIG. 10
FIG. 11
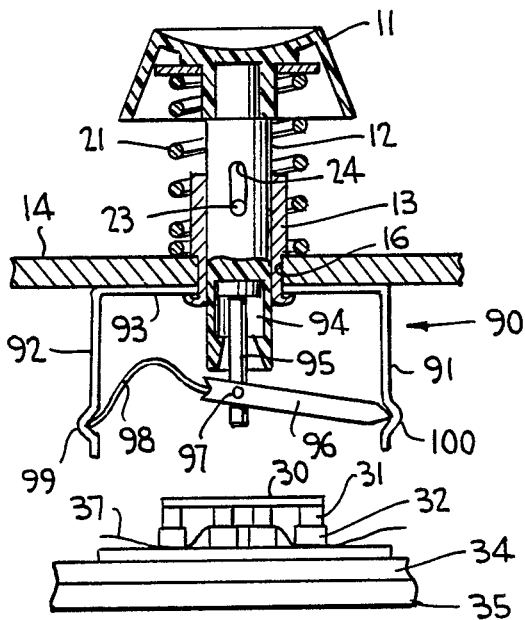
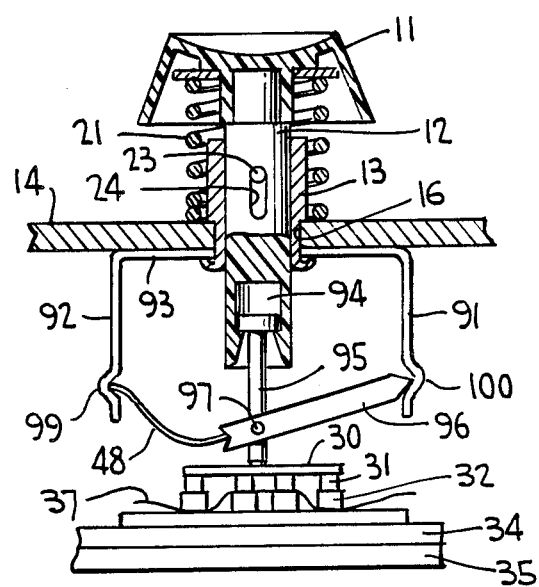

PARALLEL ENCODED PIEZOELECTRIC KEYBOARD SWITCH AND ARRAY

BACKGROUND OF THE INVENTION

1. Technical Field

The present invention relates to keyboard switches and keyboard assemblies. More particularly, the present invention relates to an improved piezoelectric keyboard switch and keyboard assembly, including the circuitry for encoding key-entered data.

2. Discussion of the Prior Art

Conventional data entry keyboards generally employ single pole switches configured in an X-Y matrix array which is scanned electronically in order to determine the actuation (i.e. key-up) or non-actuation (i.e. key-down) status of individual keys. Key status data is then encoded by a microprocessor (for example, to ASCII code), buffered and then forwarded serially to a data terminal.

In X-Y matrix keyboards of the type described, seven to ten millisecond keyboard scan cycle periods are employed because individual key bounce periods range between two and ten milliseconds. As a result, nearly simultaneous depression of two or more keys within a time aperture of less than ten milliseconds may result in an out-of-order sequence character printout, unless the scan sequence happens to be in the same order in which the keys were depressed. For example, assume the characters "t" and "h" are stroked consecutively in a period less than the total keyboard scan period, and that the scan sequence position for "t" is after the scan sequence position for "h". The "h" would be displayed before the "t". Alternatively, a complex and costly priority encoder could be implemented to overcome this problem in the X-Y array concept.

As data transfer rates between keyboards and terminals become higher, more stringent requirements will be made of keyboard hardware beyond the viable limit of X-Y matrix technology. A possible solution to this problem is the use of parallel key encoding by means of an array of uniquely coded piezoelectric switches which apply their binary coded signals to parallel data buses. Such an arrangement is described in U.S. Pat. No. 3,940,637 (Ohigashi et al). The keyboard switch structure disclosed in the Ohigashi et al patent employs a keybar which is selectively depressed to resiliently deform a film layer transversely of the plane of that layer. The film has a plurality of conductive circuits or lines disposed thereon in a parallel serpentine design to serve as the data buses. Individual areas of the film are disposed below respective keybars, each area including a plurality of piezoelectrictreated portions of the film. The piezoelectric portions are connected to respective data buses in accordance with a binary code which uniquely defines each key switch. When a key is depressed, its actuator bar deforms the film in its area to generate electrical signals in the piezoelectric portions of that area. Those signals appear on the data buses to which the deformed piezoelectric portions are permanently connected.

While the Ohigashi et al keyboard arrangement eliminates many of the problems inherent in the X-Y matrix arrays, it unfortunately introduces some of its own disadvantages. Specifically, location of multiple switch areas on the same film can result in incidental actuation of surrounding switches when the film is deformed by a single actuator bar. Moreover, the resilience of the deformed film results in some key bounce problems as well as unfamiliar "feel" and "sound" characteristics upon depression of a key by the operator.

Apart from the characteristics of the key switch itself, the Ohigashi et al patent does not concern itself with the practical requirements of circuitry required to convert the parallel binary key codes into serial data required for terminal entry. Such keyboard entry circuitry must not only convert the character data to serial form, it must also provide for such functions as "character repeat", "shift", and other such functions in a reliable and inexpensive manner while preventing interference between successively entered characters.

OBJECTS AND SUMMARY OF THE INVENTION

It is, therefore, an object of the present invention to provide an improved piezoelectric keyboard switch.

It is another object of the present invention to provide a piezoelectric keyboard switch which is not subject to incidental actuation by adjacent switch actuation, and which reliably provides parallel coded output signals uniquely identifying that switch.

A further object of the present invention is to provide a piezoelectric keyboard switch which has a familiar feel and sound upon actuation, yet responds positively and reliably to depression of the actuator key.

It is still another object of the present invention to provide a piezoelectric keyboard switch array in which data for each keyboard switch is provided in parallel binary form on data lines common to each switch, and wherein data entry circuitry reliably distinguishes between successively entered characters while converting the parallel data into serial form.

A still further object of the present invention is to provide a keyboard switch for transducing a mechanical depression force applied to a key member into electrical signals representing that key member, wherein the switch includes a housing, an actuator movable in depression and elevation in the housing along a first dimension in response to depression and elevation of the key member, a snap action spring which snaps between first and second positions along the first dimension, means linking the actuator to the snap action spring in order to snap the spring from its first position to its second position when the actuator moves a predetermined depression distance from its rest position, and for snapping said spring from its second position to the first position in response to predetermined elevation position movement of the actuator, a plurality of spaced piezoelectric transducer members which provide respective electrical signals when mechanically stressed, a common impact-receiving plate secured to each of the transducer members, and support means disposed on the other side of the transducer members so that the transducer members are disposed between the support means and the impact-receiving plate, a percussion applicator secured to the snap action spring in order to forcefully impact against the impact-receiving plate to mechanically stress the transducer members against the support means when the snap action spring snaps from its first to its second position, and a return bias spring for continuously urging the actuator in an elevational direction.

Another object of the present invention is to provide an electrical keyboard assembly of the type wherein individual keyboard switches in an array are selectively actuable to apply an n-bit binary number in parallel form on n-respective common data lines, and a processing circuit for processing the n-bit binary numbers wherein n-resettable latch means are provided, each being connected to a respective data line to receive signals appearing on that line and to provide a data signal representing the binary state of the received signal, and n-clocked register members, each responsive to application of a gate signal thereto for entering data from a respective latch means. With respect to this keyboard assembly, a further object of the invention is to provide timer means responsive to application of a trigger signal thereto for providing the gating signal for the individual register means after the elapse of a first predetermined time interval following application of the trigger signal, and for providing a reset signal to reset each of the latch means after the elapse of a second prdetermined time interval following the application of the trigger signal, the second predetermined time interval being longer than the first predetermined time interval.

It is a further object of the present invention to provide a method for transducing a mechanical depression force applied to a keyboard into an n-bit binary signal using npiezoelectric transducers, wherein, in response to a predetermined depression force applied to the key, a percusive force is applied to a common impact-receiving plate and, during continued depression of the key and for a short time after removal of the depression force from the key, that compressive force is maintained against the plate.

In accordance with the present invention, a piezoelectric keyboard switch is characterized by a flat snap action spring which carries a percussive member that impacts against an impact-receiving plate when the spring is snapped to its actuation position. The plate, in turn, transmits the impact to a plurality of spaced piezoelectric transducers secured at the opposite side of the plate. The snap-action spring member maintains forceful contact between the percussive member and the impact-receiving plate so that the piezoelectric transducers are compressed against a support member for as long as the key remains actuated to maintain the snap action spring in its second position. A lost motion linkage between the key actuator and the spring permits the spring to remain in its actuation position, mechanically stressing the piezoelectric transducers, for a short period of time after the key is released and begins moving back to its rest position.

A plurality of such keyboard switches are arranged in a keyboard array of columns and rows. A plurality of data buses, in the form of conductive strips, are positioned in mutually spaced parallel relation in a serpentine pattern beneath the transducers such that each bus passes beneath a corresponding transducer of each switch in the array. A layer of electrically insulating film is disposed between the transducers and the data buses and is selectively etched to permit electrical contact between certain transducers and buses. In this manner, each switch can be identified by a binary code represented by the contact between its transducers and the data buses.

Circuitry for entering the coded key data into a terminal includes respective latches for each of the data buses and individual registers responsive to the state of the individual latches. A timer responds to the presence of a character code in the latches to clock the registers to permit entry of the data from the latches therein. A subsequent timing signal resets the latches and initiates transfer of the register data into a programmable read-only memory. Data from this memory is converted into serial binary form and conducted to the terminal.

BRIEF DESCRIPTION OF THE DRAWINGS

These and other objects, features and many of the attendant advantages of the invention will be better understood upon a reading of the following detailed description when considered in connection with the accompanying drawings wherein like parts in each of the several figures are identified by the same reference numerals, and wherein:

FIG. 10 is a view in elevation and partial section of another embodiment of the piezoelectric key switch of the present invention, showing the key switch unactuated; and FIG. 11 is a view in elevation and partial section of the switch of FIG. 10, showing the switch actuated.

DESCRIPTION OF THE PREFERRED EMBODIMENTS

Figure 1:
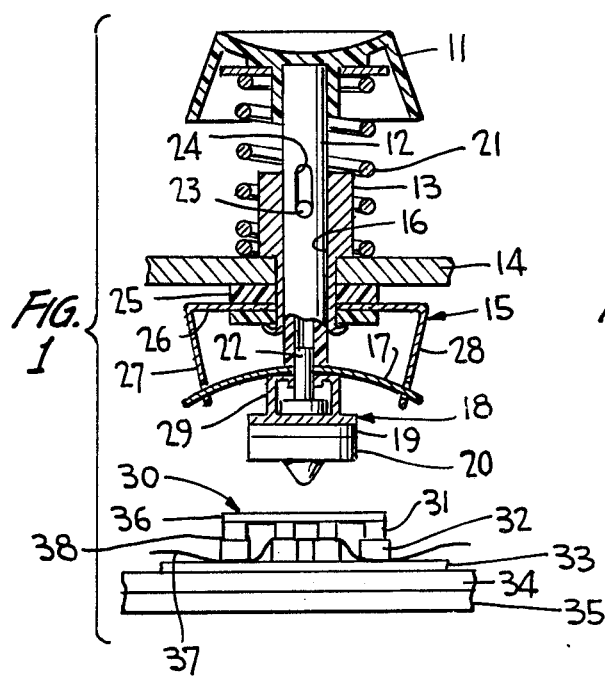
FIG. 1 is a view in elevation and partial section of a one embodiment of the piezoelectric key switch of the present invention, showing the key switch in its rest or non-actuated state.

Referring specifically to FIG. 1 of the accompanying drawings, a key cap 11 is secured at one end of an actuator rod or plunger 12 which takes the form of a cylindrical stem passing longitudinally through an aperture 16 in a mounting panel 14. Mounting panel 14 is part of a keyboard assembly housing which is only partially illustrated. In the preferred embodiment, wherein a plurality of switches are arranged in a keyboard array, mounting panel 14 contains a plurality of rows and columns of apertures 16 at which a respective plurality of switches are secured to the panel. A plunger guide member 13 takes the form of an annular sleeve surrounding a portion of plunger 12 which resides above the mounting panel 14. A limit pin 23 extends internally through the plunger guide 13 in a direction generally parallel to the upper surface of mounting plate 14. The limit pin is disposed in a longitudinally-extending slot 24 disposed in plunger 12 and serves to limit the depression and elevation motion of plunger 12 along its longitudinal axis. A helical bias spring 21 is disposed coaxially about plunger 12 and plunger guide 13 and has its ends abutting key cap 11 and the upper surface of mounting plate 14. Bias spring 21 acts to restore the plunger 12 to its non-actuated or at-rest position as illustrated in FIG. 1.

Figure 3:
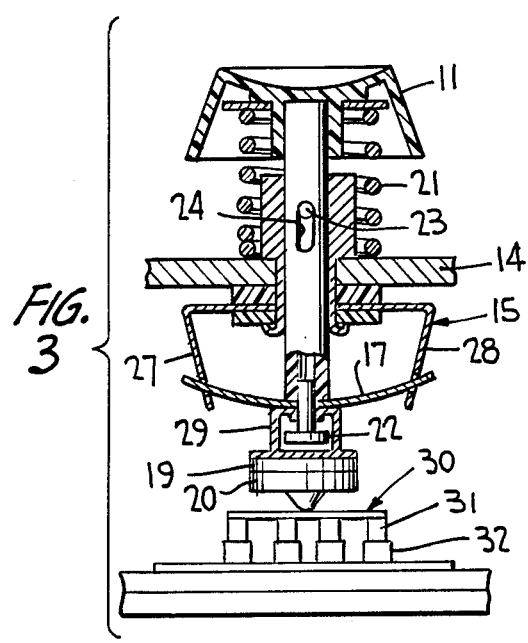
FIG. 3 is also a view in elevation and partial section of the switch of FIG. 1, showing the switch in its fully actuated or depressed state.

A mounting bracket 25, secured to the underside of mounting plate 14, supports a yoke spring 15 beneath the mounting plate. The yoke spring 15 is preferably made of spring metal, but can also be made of resilient plastic, or the like, and includes a central portion 26, secured to bracket 25, and two downwardly depending arms 27 and 28. The arms 27 and 28 are capable of resiliently pivoting about respective ends of central portion 26 so as to be spread apart in response to suitable forces applied therebetween. A flat spring member 17, which may take the form of a generally rectangular, circular, or other suitable shape member, has its ends secured to the yoke spring arms 27 and 28 approximate the lower ends of those arms. Spring member 17 is a snap action spring made of suitable spring steel or other metal or plastic which is capable of permitting member 17 to achieve two stable states. Specifically, a first stable state of snap spring member 17 is illustrated in FIG. 1 and shows that member having a concave surface facing downward and a convex surface facing upward. The second stable state of member 17, which can be achieved by pushing downward on the middle of the plate against the support forces provided at the ends thereof, is such that the upper and lower surfaces are reversed; that is, in the second stable state of spring member 17, the upper surface is concave and the lower surface is convex. This state is illustrated in FIG. 3 which is described in detail hereinbelow.

A pawl member 22 takes the form of a bolt having a shaft of relatively small diameter extending throughout most of its length and a base of considerably shorter length but much wider diameter The small diameter end of the shaft of pawl 22 is secured firmly to the lower end of actuator plunger 12 so that the pawl member extends downwardly therefrom. Snap-action spring member 17 is centrally apertured to receive the lesser diameter shaft portion of pawl member 22 therethrough so that the pawl member is capable of moving transversely through the spring plate 17 with the wider diameter lower end of the pawl member serving as a stop. A lower support member 18 includes a generally circular plate above which is secured a hollow sleeve portion 28 having its upper rim secured to the bottom surface of snap action spring plate 17 concentrically about the aperture defined in the spring plate. With this construction, the pawl member 22 projects into the hollow sleeve member 28 so that the wider diameter lower end of the pawl member is trapped within sleeve member 28 but is movable longitudinally therein. The lower surface of the support member 18 has a generally circular elastomer pad 19 secured thereto. A percussion member 20, having a cylindrical upper part which depends from elastomer pad 19, includes a converging, generally conical force-applying portion at its lower end. The percussion member 20, by virtue of its connection to snap action spring plate 17 through elastomer pad 19 and support member 18, moves longitudinally (vertically in FIG. 1) with the spring plate as the spring plate snaps between its two stable positions.

Figure 5:
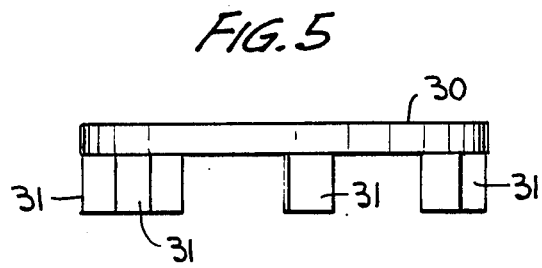
FIG. 5 is an elevation view of the piezoelectric transducer assembly employed with the switch of FIG. 1.
Figure 6:
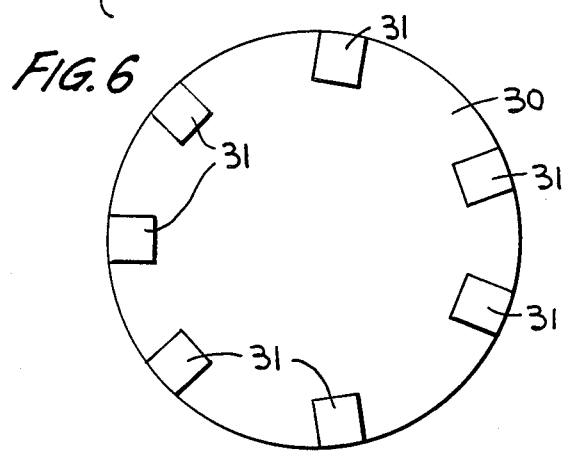
FIG. 6 is a bottom view in plan showing the piezoelectric transducer portion of the switch of FIG. 1.

A plurality of piezoelectric transducers 31 are secured in spaced relation to the underside of a preferably metal strike plate 30. As also seen in FIGS. 5 and 6, the strike plate 30, which is an impact-receiving member, takes the form of a circular plate disposed directly below and in the longitudinal path of the percussion member 20. The strike plate is grounded and is secured to the individual piezoelectric transducers 31 by means of a thin layer of conductive adhesive material 36. Although the piezoelectric transducers 31 are illustrated as being oriented in equally spaced positions about a circle near the periphery of strike plate 30, any spaced mounting, consistent with the operation described herein, will suffice. It is preferable, in order to achieve equal distribution of the mechanical stress applied to the transducers from the strike plate, that the transducers by geometrically centered about the common longitudinal axis of plunger 12 and strike plate 30.

Figure 7:
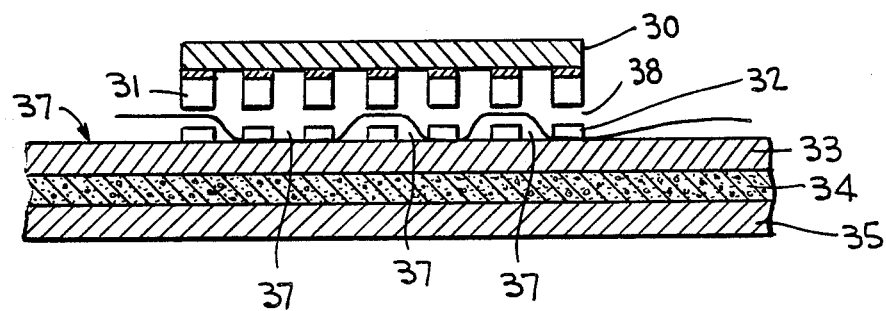
FIG. 7 is a detailed view in elevation showing the mounting assembly for the piezoelectric transducer portion of the switch of FIG. 1.
Figure 8:
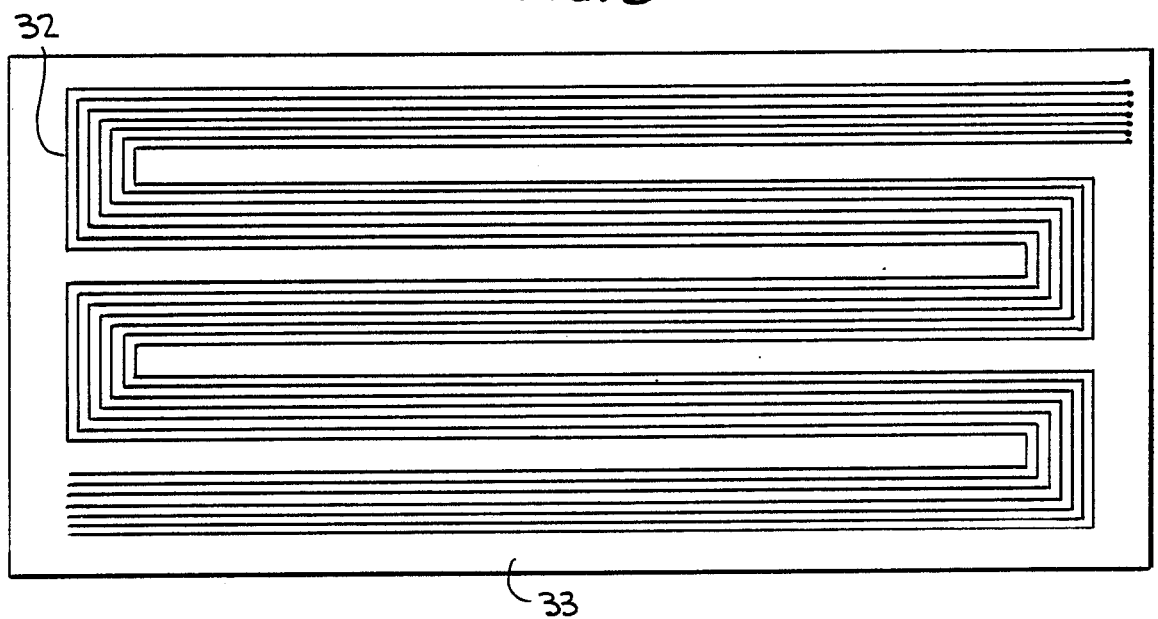
FIG. 8 is a diagrammatic illustration of a typical pattern of data lines arranged in a parallel serpentine pattern below an array of switches in accordance with the present invention.

A bottom mounting plate 35, which may be part of an individual switch housing or part of a keyboard assembly, has a vibration-absorbing layer bonded on its upper surface by means of a suitable adhesive. The upper surface of the vibration-absorbing layer 34 has a printed circuit board 33 secured thereto via adhesive. A plurality of data lines 32 extend in spaced parallel relation along the upper surface of printed circuit board 33 immediately beneath the keyboard switch. Data lines 32 are initially covered by an electrically insulative epoxy mask 37 which is selectively coated so as to expose different portions of the data buses in the region beneath the various switches of a keyboard array. The various piezoelectric transducers 31 are secured by means of an electrically conductive adhesive 38 to the underlying data buses 32 at locations where the epoxy mask 37 has been etched to expose the data buses. The mounting of the piezoelectric elements 31 between the strike plate 30 and data lines 32 is best illustrated in FIG. 7. The piezoelectric transducer members are spaced so that each aligns with a single line 32 of the parallel array of data lines. These data lines 32 pass under each switch in a keyboard array so that each line can selectively receive a signal from a transducer 31 of a plurality of switches. A typical layout of the data lines 32 on printed circuit board 33 form a serpentine pattern as illustrated schematically in FIG. 8.

Operation of the piezoelectric keyboard switch of the present invention may best be understood by referring sequentially to FIGS. 1, 2, 3, and 4 of the accompanying drawings. Specifically, FIG. 1 illustrates the keyboard switch in its rest or inactive position wherein the return spring 21 holds the plunger 12 and key cap 11 in its upper limit position so that the bottom end of slot 24 is urged against the limit pin 23. In this condition, the snap action spring 17 is in its unactuated position wherein its lower surface is concave and its upper surface is convex. The lower support member 18, elastomer pad 19 and percussion member 20 are maintained in a rest position at a predetermined height above the strike plate 30.

Figure 2:
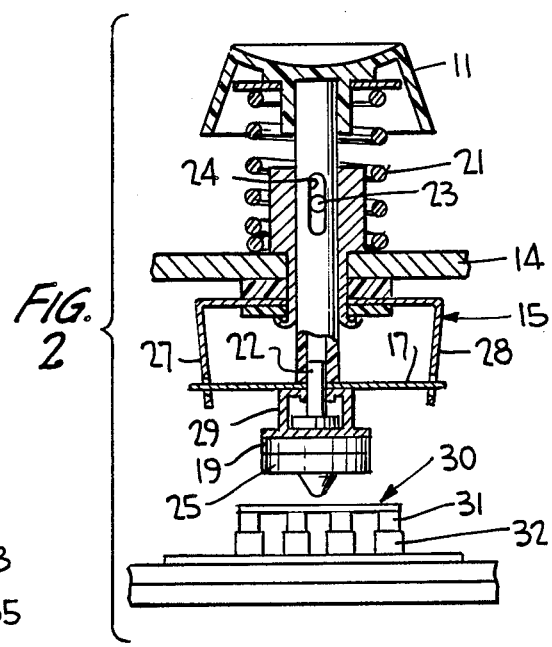
FIG. 2 is also an elevation view and partial section of the switch of FIG. 1, showing the switch in a partially actuated state.

Referring to FIG. 2, the switch is illustrated in a transient condition which occurs immediately after depression of the key cap 11 has been initiated and prior to the activation of the transducer elements 31. In this position, the lower shoulder of plunger actuator 12 has caused the flat snap action spring member 17 to be depressed at its center so that it assumes a transient planar condition wherein the yoke spring arms 27 and 28 have spread slightly. Once this illustrated critical position is passed, the pressure of the yoke spring arms on snap action spring member 17 causes that spring member to snap downward to its second stable state illustrated in FIG. 3. In this second stable state, the spring member 17 has passed the critical position so that its upper surface is now concave and its lower surface is convex. The snap action of the spring to this second stable state causes the lower end of percussion member 20 to impact strongly against the strike plate 30. In this regard, the strike plate is sufficiently close to the percussion member 20 to prevent flat spring member 17 from achieving its natural bow in its second stable state. This has the result of increasing the impact force with which the percussion member strikes the strike plate while permitting a continued urging of the percussion member against the strike plate while the spring remains in its second position. The spring rate combination of yoke spring 15 and snap action spring 17, along with the combined mass of lower support member 18, conductive elastomer pad 19 and percussion member 20, the effective contact surface area of percussion member 20, the compliance characteristics of elastomer pad 19 and transducers 31 and their mounting, all serve to determine the instantaneous percussion force sustained by the transducers 31 as the percussion member 20 strikes plate 30. It must be stressed that a continuous static force is applied to the strike plate after the initial percussion force is depleted to provide an electrical contact. This electrical contact is employed in the keyboard assembly circuit to sense continued key depression for repeat character functions in a given key.

Figure 4:
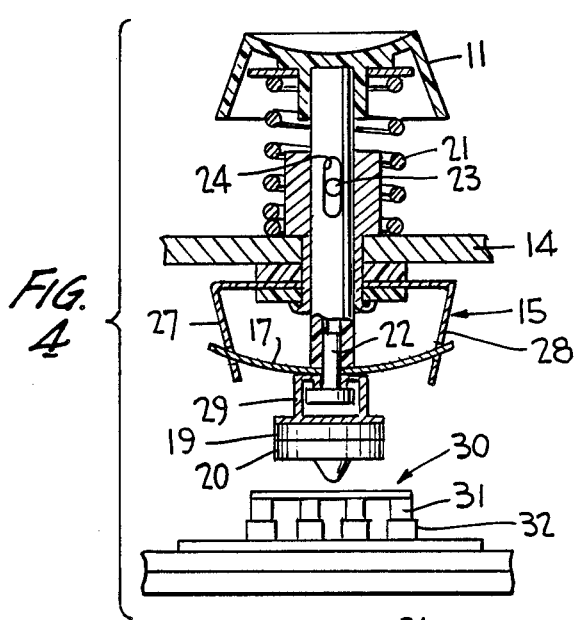
FIG. 4 is a further view in elevation and partial section of the switch of FIG. 1, showing the switch after it has been released by the operator and has moved partially toward its at-rest or non-actuated position.

FIG. 4 illustrates the condition of the switch immediately after the key has been released. When the operator's finger has been removed from the key, return bias spring 21 forces plunger 12 upward along with the return pawl 22. The diametrically enlarged portion of the pawl experiences lost motion movement within sleeve 29 before it begins to exert upward pressure on the underside of snap action spring member 17. During this lost motion portion of the upward or elevational travel of plunger 12, the percussion member 20 remains in compressive contact with strike plate 30 to maintain the mechanical stress on the individual piezoelectric transducers 31. When the diametrically enlarged portion of pawl 22 begins to exert upward force on the underside of spring 17, the spring begins to move toward its upper stable position, thereby withdrawing percussion member 20 from its contact with strike plate 30. Further upward movement of the plunger 12 forces the spring 17 to pass through its critical point and snap to the position illustrated in FIG. 1. Upward travel of the plunger 12 is limited by the limit pin 23 to return the assembly to its rest or inactive position.

Operation in the manner described above affords a familiar tactile "feel" for the key switch while providing a controlled percussion force to the transducers. In other words, it is the action of the spring which determines the impact force applied by percussion member 20 to the strike plate 30. This force is not determined by the force applied by the operator; yet, the operator feels the resistance of the spring 17 as a familiar "feel" of keyboard switch operation. In addition, anti-tease provisions are inherent in the structure and, given a spring rate which is higher than the fastest finger kinematic response, performance is independent of typing speed.

The parallel binary code signal provided by each transducer 31 when connected to a data line provides a binary "1" at each data line connection and a binary "0" at each unconnected transducer. The number of lines required for a given keyboard is determined by the number of keys on the parallel bus. If no more than sixty-three keys are employed, six data lines will be required; between sixty-four and one hundred twenty-seven keys requires seven data lines.

A circuit for receiving data from a keyboard of the type described above is illustrated in FIG. 9 to which specific reference is now made. The individual data lines D0 through D5 are connected across respective resistors R2 through R7 to the S input terminal of a respective RS latch L1 through L6. The other ends of the resistors R2 through R7 are grounded. The output signals from latches L1 through L6 are connected to the data input terminals of respective D-type registers D0 through D5, respectively, which are illustrated as part of a common register 40. The output signals from individuals registers D0 through D5 are connected to corresponding address input terminals A0 through A5 of a programmable read-only memory (PROM) 41. The A6 address line of PROM 41 is derived from a register D6 from register unit 40. Register D6 in turn receives the inverted version of a shift signal, generated at the keyboard by a separate key, and applied to register D6 through NOR gate 42 configured as an inverter. The shift signal is applied across resistor R8 which has its other end connected to a positive voltage.

The A7 address input of PROM 41 is derived from the control signal, which is also separately generated at the keyboard and applied via an inverter 43 which receives the control signal across resistor R1. The other side of that resistor is also connected to a positive voltage.

The output signal from register D6 is also connected to another NOR gate 44 which delivers its output signal to the address terminal A8 of PROM 41. The A9 address terminal of PROM 41 is grounded.

A further NOR gate 45 receives the output signals from each of latches L1–L6. The output signal from NOR gate 45 is connected to the inverting trigger input of a one-shot multivibrator 47. The period of one-shot multivibrator 47 is determined by the resistance of resistor R9 and the capacitance of capacitor C1. The $\overline{Q1}$ output signal from one-shot multivibrator 47 is applied to one input of a two-input NOR gate 48. The output signal from that NOR gate is applied through an inverter 49 to the clock input terminal of register unit 40 to simultaneously clock each of the registers D0 through D6 to accept the data applied thereto. The $\overline{Q1}$ output signal from one-shot multivibrator 47 is also applied to a further one-shot multivibrator 50 via its non-inverting trigger input 51, the other input of which is connected to a positive voltage through an inverting input terminal. The period of one-shot multivibrator 50 is determined by the resistance of resistor R10 and the capacitance of capacitor C2. The $\overline{Q2}$ output signal from one-shot multivibrator 50 is applied through an inverter 52 and series capacitor C3 to one input of a NAND gate 53. That terminal is resistively coupled to a positive voltage through a resistor R11. The other terminal of NAND gate 53 is connected to a reset signal across a capacitor C4, that input terminal also being coupled to a positive voltage via resistor R12. The output signal from NAND gate 53 is applied to the R or reset input terminals of each of latches L1–L6.

A repeat character bus, which is discrete in itself and not necessarily part of the serpentine pattern on the printed circuit board, and which is hold at logic "one" level and brought to logic "zero" level by the depression of certain selected keyboard switches, is connected to the reset terminals of a binary counter 54 and a latch 55. These terminals are also resistively coupled to a positive voltage by means of resistor R14. Counter 54 receives, at its clock input terminal, a clock output signal from an oscillator 56. This clock signal from the oscillator is also applied to a NAND gate 57, the other input of which receives the Q output signal from latch 55. An output signal from counter 54, which changes state after a predetermined number of counts have been achieved in the counter, is passed through a series capacitor C6 and across a grounded resistor R15 to the S (set) input terminal of latch 55.

The output signal of NAND gate 57 and the $\overline{Q2}$ signal from one-shot multivibrator 50 are applied to a further NAND gate 58 which delivers its output signal to the clock terminal of a flip flop 60 and to one input terminal of a NOR gate 61. The output signal from NOR gate 61 is used to clock a USART (Universal Synchronous/Asynchronous Receiver/Transmitter) 62 which receives the eight output bits 01 through 08 from the PROM 41 at its input terminals TR1 through TR8, respectively. The USART 62 is used to convert the eight-bit parallel word from the PROM to serial format at its TR0 output terminal which is connected to both inputs of a NAND line driver 63. The output signal from NAND line driver 63 is delivered as the serial data output from the circuit. The output terminal TR0 from USART 62 is provided with an indicator circuit including an inverter 64 connected in series with an LED 65, resistor R19 and a positive voltage.

The output data lines 01 through 08 of PROM 41 are also connected to individual bits of an octal tri-state gate 66 which is programmed to provide the character line feed onto the eight-bit bus between the PROM and the USART 62. The same bus also provides input connections to NOR gate 67, the connections being coded by means of inverters in selected lines so as to activate NOR gate 67 when a carriage return character appears at the output terminals of PROM 41. The output signal from NOR gate 67 is applied to the data input terminal of flip flop 60. The $\overline{Q}$ output terminal from flip flop 60 is applied to the reset input terminal of a counter 68, the clock signal for which is derived from an oscillator 69. That clock signal is also provided to a NAND gate 70 along with the Q4 output signal from couter 68. The Q8 output signal from counter 68 is applied to the reset input terminal of flip flop 60. Flip flop 60 also receives a signal from NAND gate 58 through an inverter 71.

An alphalock signal is applied to the clock input of a flip flop 72 across a resistor R16 coupled to ground. The set input for flip flop 72 is directly coupled to ground while the reset input for that flip flop is resistively coupled to ground through resistor R17 and to a positive voltage through capacitor C7. The $\overline{Q}$ output signal from flip flop 72 is connected to the data input terminal of that flip flop and also to the second input of NOR gate 44 which controls the address terminal A8 of PROM 41. The Q output terminal of flip flop 72 is applied through an inverter 73 to an LED indicator 74 which in turn is resistively connected to a positive voltage by means of a resistor R18.

Figure 9A:
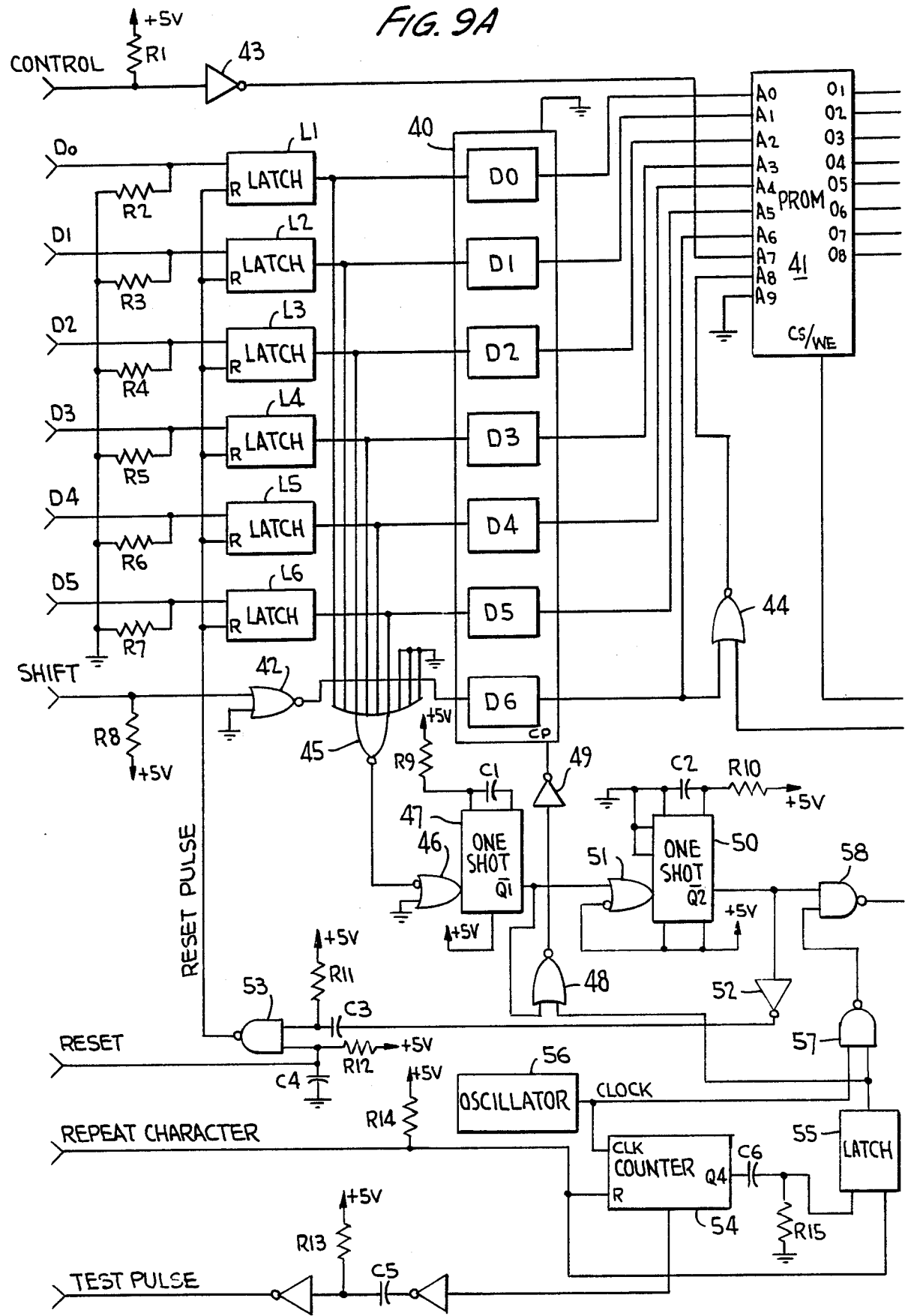
FIGS. 9a and 9b constitute an electrical schematic diagram of the keyboard interface circuit employed in conjunction with the keyboard array of the present invention.
Figure 9B:
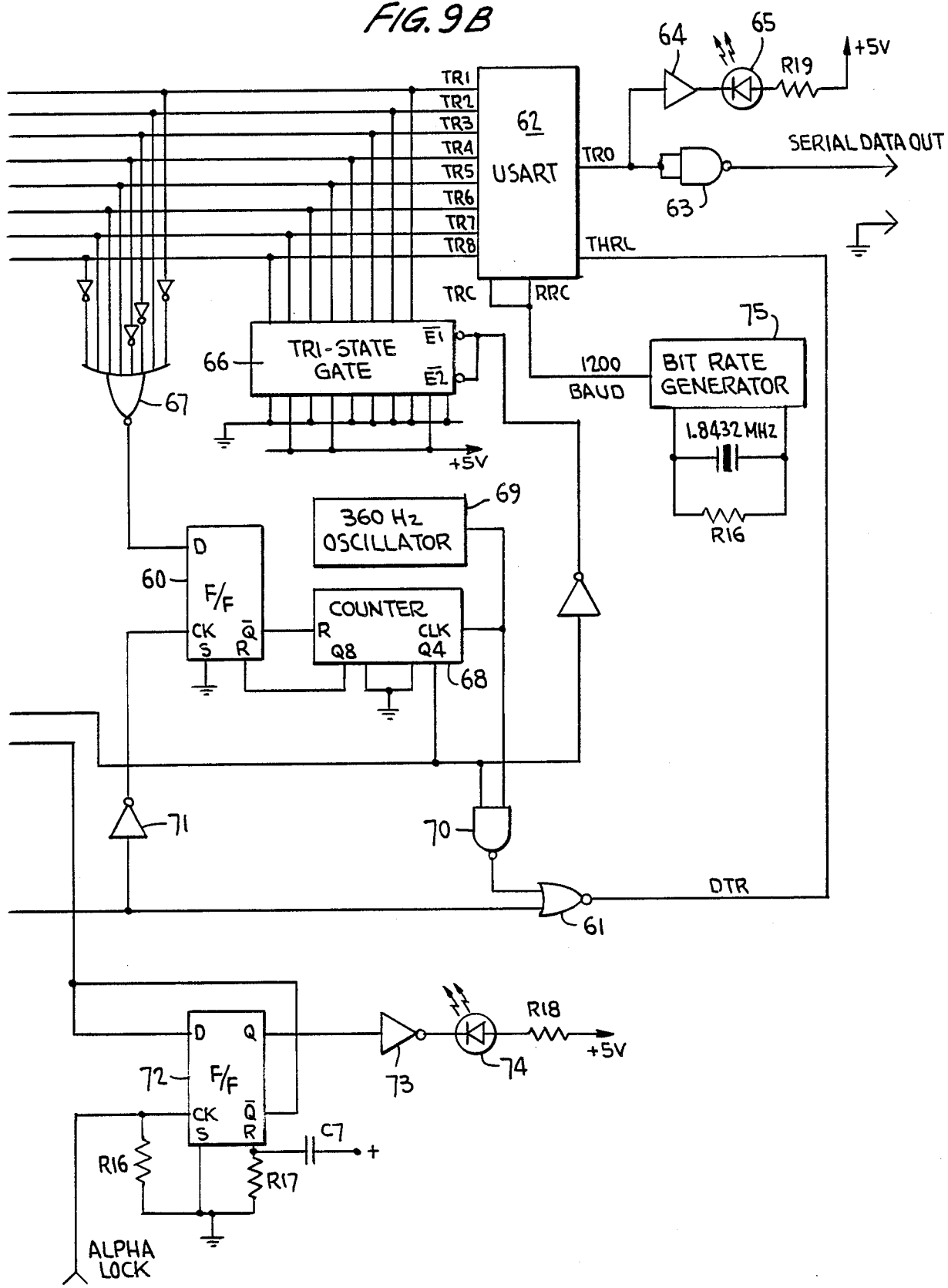

The operation of the circuit of FIG. 9 may best be understood by first realizing that the primary function of the circuit is to store a binary bit pattern from an actuated piezoelectric key switch, transfer the binary information to the address leads of PROM 41 which in turn translates this information to a desired ASCII code for the respective depressed key. The ASCII code is placed on data buses where it is converted from parallel to serial form at USART 62 to be transmitted to a terminal or other device under the control of bit rate generator 75 timed by an oscillator circuit.

As described hereinabove, an actuated piezoelectric key switch provides a binary bit pattern at lines D0 through D5. This results from a force being applied to an array of piezoelectric transducers situated so as to be electrically conductive so as to apply the appropriate binary signals on the set of conductive tracks. When a force is applied, the piezoelectric transducers are excited to produce an electronic pulse on their respective data track or tracks. This pulse has an extremely fast rise time and reaches an amplitude of several volts with a pulse width of normally less than twenty microseconds. This pulse is transferred to the set input terminals of latches L1 through L6 by leads D0 through D5. The latches are set only the respective lines that are coded for the key which was depressed. Upon receiving data pulses, the output signals from those latches which receive pulses switch from a logic 0 to a logic 1 state. This occurs when the leading edge of a pulse reaches one-half the supply voltage. The latch remains in this state until the reset pulse, at a logic 1 level, is received at the reset input terminal of each latch to restore it to its logic 0 state.

Upon the first latch being triggered after all of the latches have been reset, one of the eight input signals to NOR gate 45 goes high to force the output of that gate low or to the logic 0 level. This triggers a series of time delays effected by one-shot multivibrators 47 and 50. After the first time delay effected by one-shot multivibrator 47, a pulse is delivered to the clock input terminal of registers 40 via NOR gate 48, provided that this NOR gate is not inhibited by the repeat character function described below. The function of the time delay provided by one-shot multivibrator 47 is to provide time for incoming data to stabilize in latches L1 through L6 before data can be clocked into the registers D0 through D6.

The second time delay, provided by one-shot multivibrator 50, is of shorter duration than the previously described time delay and allows time for the clocking of data into registers D0 through D6 before generating a pulse signalling that data is ready to be applied to PROM 41 and before resetting the latches L1 through L6 which contain the data being clocked into the registers D0 through D5. As data is clocked into the registers D0 through D6, the output terminals of these registers change to coordinate with the respective binary number being applied thereto. Once the transfer is complete, the binary signal in registers D0 through D5 matches the binary code generated by the excited array of piezoelectric transducers at the activated key switch. As noted above, the output signals from each of registers D0 through D6 are connected to respective address terminals of PROM 41. Each individual binary code applied at an address of the PROM corresponds to a location in which a corresponding even parity ASCII eight-bit word is stored to represent the character matching the PROM 41 address. The output pulse widths from one-shot multivibrators 47 and 50 are controlled by external RC time constant networks, namely R9, C1 and R10, C2. By changing either the resistance or capacitance value in either network, the time delay provided by each one shot can be adjusted. The time delay provided by one-shot multivibrator 47 may normally be varied to lengthen or shorten the time aperture for transfer between the latches and the registers, the time of which can be directly related to the N-key rollover of the system.

It should be noted that certain keys can be programmed with a repeat character feature. The repeat character rate is determined by clock oscillator 56 which also functions to determine the delay between the time a key is depressed and a repetitive action begins. The output signal from oscillator 56 appears at the clock input terminal of counter 54 which is a twelve-bit binary counter. The delay in this frequency divider type counter is determined by the output terminal one wishes to select for a particular application. In the illustrated embodiment, the Q4 output terminal from counter 54 is employed. The rationale for this relates to the fact that sixteen characters per second is used in the present system as the repeat rate for characters to be repeated. Therefore, the frequency of oscillator 56 is chosen at 16 Hz. This clock signal is also applied through NAND gates 57 and 58 and NOR gate 61 to clock the USART 62 which provides the output data from the circuit in serial form. With the output signal from oscillator 56 set at 16 Hz, a 0.5 second delay can be obtained from counter 54 at output terminal Q4. Likewise, if output terminal Q5 is employed a one second delay may be obtained. For any delay period in between, the clock rate must be adjusted or the output of the counter output signal can be delayed by external capacitance such as capacitor C6 to shape the wave form and thereby prevent latch 55 from triggering until after the desired delay. In the embodiment illustrated, a 600 millisecond delay is intended so that the Q4 output terminal is employed with a 0.01 microfarad capacitor for C6 connected across a 10K ohm resistor for R15.

In order for the repeat character circuit to be enabled, the repeat character input signal must be pulled to a low logic level from a normally high (logic 1) level. This is achieved by the connections at the particular key switch. Resistor R14 is used to hold both counter 54 and latch 55 in their reset states until such time as a logic 0 appears on the repeat character line. When this occurs, the clock output signal from oscillator 54 clocks counter 54. After 500 milliseconds, the Q4 output terminal of this counter goes to logic 1 and, after a 100 millisecond period determined by capacitor C6 and resistor R15, latch 55 is set so that its output switches to a logic 1 state. This enables NAND gate 57 so that the clock pulses provided by oscillator 56 may be gated through NAND gate 58 and NOR gate 61 to the USART 62. Serial data is thus transmitted until latch 55 is reset by returning the key switch in question to its normal position.

When a key having the repeat character capability is depressed for a sufficiently long interval to permit entry into the repeat character mode, the circuit is inhibited from accepting new data. This is effected by NOR gate 48 which precludes passage of the clock pulse to registers D0 through D6 for as long as the repeat character mode remains in effect. Under such circumstances, the latches L1 through L6 will be reset but no data entering these latches will be recognized or clocked into latches D0 through D5. Rather, the data in latches D0 through D5 remains the data corresponding to the character which is being repeated in the repeat character mode. This character is thus translated through PROM 41 to be converted into serial form on a repetitive basis, sixteen times per second, until the repeat character mode is terminated.

As noted above, NOR gate 67 has its input signals programmed to recognize a carriage return character in ASCII format. When a carriage return is detected, a line feed signal must be supplied. The USART 62, as noted above, is employed to convert the eight-bit parallel word to serial format and provide the serial word out from the circuit at a rate of 1200 BAUD. When the carriage return character appears on the output bus from PROM 41, the output signal from NOR gate 67 goes high to trigger flip flop 60. This flip flop enables the timing circuit including counter 68 and oscillator 69. Oscillator 69 provides an output signal having a frequency of 360 Hz which allows time for the carriage return character to be provided at the output. The timing circuit then disables the $\overline{CS}$/WE terminal at PROM 41 to force the PROM into a high impedance oupput condition. At the same time, the octal tri-state gate 66, which is programmed to provide the line feed output character onto the eight-bit bus is enabled. This character is then converted to serial format by USART 62 and provided via gate 63 on the serial data output line. When this is completed, PROM 41 is returned to its normally selected state and normal operation of the circuit continues.

The keyboard shift function is implemented by the use of a discrete set of tracks which are not on the parallel incoming data buses D0 through D5. The shift key is a momentary contact key switch which remains closed as long as the key remains depressed. Closure of the shift key forces the shift input signal, which is normally held high by the resistor R8 connected to a positive voltage, to a logic 0 state. This state is gated by means of the NOR gate 42 into register D6 of the register unit 40. The output signal from register D6 is, as noted above, connected to the A6 address terminal of PROM 41. When the shift signal is true, this address lead goes to its true state and a new section of the memory of PROM 41, containing the shifted or upper case set of characters for the keyboard, is addressed.

By depressing a particular key designated for the alpha-locked function, a pulse originating from a piezoelectric transducer is delivered by another discrete track, not included in tracks D0 through D5, to clock the input of flip flop 72. This causes flip flop 72 to change state so that it may be turned on or off by one stroke of the key. When the alpha-locked signal is true, the $\overline{Q}$ output signal of flip flop 72 goes high and is gated to the A8 address terminal of PROM 41 so that a different set of characters may be addressed by the data in registers D0 through D5. For example, the alpha characters may be upper case characters and all other keys remain in normal lower case state. By gating the alpha-lock address of the PROM 41 with the shift address of the PROM at gate 44, the shift function may be made to take priority over the alpha-lock function. This is done, in the present invention, in order that all characters may be shifted independently of the alpha-lock function.

The control function of the keyboard is mechanized much the same way as the shift function. When the control key is depressed, the control signal, applied through inverter 43, addresses the A7 section of PROM 41 in order to permit another section of the memory to be addressed and provided at the output in normal fashion.

By way of example only, the following component values and circuit types may be employed in the system illustrated in FIG. 9:

Resistors: R1 is 100 Kohms, R2 through R7 are 1.5 mohms, R8 is 100 Kohms, R9 and R10 are adjustable, R11 and R12 are 10 Kohms, R13 is 5.6 Kohms, R14 is 100 Kohms, R15 is 10 Kohms, R16 is 15 mohms, R17 is 10 Kohms, R18 is 680 ohms and R19 is 5.6 Kohms.

Capacitors: C1 and C2 are adjustable, C3 is 0.005 microfarads, C4 is 0.02 microfarads, C5 and C6 are 0.01 microfarads.

Integrated Circuits: L1 through L6 are individual latches in an MC14043 Quad RS latch, register 40 is a 74LS374 low power octal D-type register, PROM 41 is an Intel 2708 programmable read-only memory, one-shots 47 and 50 are MC14538 one-shot multivibrators, counter 54 is an MC14040 binary counter, latch 55 is an MC14043 latch, flip-flop 72 and flip-flop 60 are part of an MC14013 flip-flop, counter 68 is an MC14017 decade counter, gate 66 is an SN74LS244 octal tri-state gate, USART 62 is a TR1402A universal synchronous/asynchronous receiver/transmitter, and bit rate generator 75 is an MC14411 bit rate generator.

Referring specifically to FIGS. 10 and 11, another embodiment of the key-switch of the present invention differs from the embodiment of FIG. 1 primarily by virtue of the spring mechanism employed. Instead of the spring yoke 15 of the FIG. 1 embodiment, the embodiment of FIG. 10 employs a rigid yoke member 90 having two depending parallel-spaced arms 91, 92 joined by a crosspiece 93. The crosspiece extends along the underside of panel 14 and is centrally apertured to receive guide 13 which is upturned at its lower end to hold the crosspiece against the panel. The lower end of actuator rod or plunger 12 is hollowed to define a chamber 94 which retains the diammetrically enlarged upper end of a lost-motion pin member 95, the lower end of which extends down through the lowermost part of the plunger between yoke arms 91, 92.

A rigid swing arm 96 has a recessed end and a knife edge end and is pivotally mounted on the exposed lower portion of lost-motion pin 95. The pivot point for arm 96 is very much closer to its recessed end than to its knife edge end. The pivot axis 97 about which swing arm 96 pivots extends perpendicular to the plane defined by rigid yoke 90. A generally C-shaped snap action spring 98 has one end secured to swing arm 96 at the recessed end of the swing arm. The other end of spring 98 is received in a concave V-shaped groove or notch 99 defined in yoke arm 92. A similar concave V-shaped groove or notch 100 defined in the other yoke arm 91 receives the knife edge end of swing arm 96. Grooves 99 and 100 may be equi-distant from crosspiece 93, as shown in the drawings, or not.

Spring 98 is a snap-action spring having two stable positions on opposite sides of a reference plane. It is the snap action of spring 98 which controls the force applied to the strike plate 30. Specifically, when the key switch is depressed against the bias force of spring 21, pin 95 is moved downward by plunger 12 causing swing arm to pivot about the knife edge end at groove 100. The inner end of spring 98, by virtue of its engagement to spring arm 96, moves downwardly until the spring reaches its critical point. At that point, the spring snaps downward, to the position illustrated in FIG. 11, bringing the spring arm 96 downward. The spring arm, in turn, pulls pin 95 downward until it impacts strike plate 30 and the piezoelectric array.

When the key switch is released, chamber 94 in plunger 12 pulls the pin 95 upward, drawing the swing arm 96 upward. The swing arm once again pivots about its knife edge end in groove 100 until spring 98 reaches its critical point. At this point the spring snaps upward to the position illustrated in FIG. 10.

By utilizing a rigid yoke, the captured C-shaped spring and the swing arm, the embodiment of FIGS. 10 and 11 does not depend on the spring for guidance; rather, guidance is achieved by the geometry of the rigid yoke arms.

The parallel encoded piezoelectric switch and keyboard unit described herein provides for high reliability in parallel key encoding on an individual key basis for providing data on a common bus. Protection is provided for N-key rollover based on simple logic hardware rather than software.

The repeat key function capability is provided for all alpha-numeric keys through simple logic/hardware implementation. In addition, implementation of upper case/lower case conversion is simple and inexpensive to achieve. An anti-tease feature and a low key bounce characteristic is provided without sacrificing user comfort or operating speed. Tactile and acoustic feedback is provided from the keyboard to the operator to make the individual keys feel more familiar in operation. Basic keyboard functions are provided virtually free of spurious radiation.

Having described a preferred embodiment of a new and improved parallel encoded piezoelectric element and keyboard array and processing circuitry therefor, it is believed that other modifications, variations and changes will be suggested to those of ordinary skill in the art in view of the above teachings. It is, therefore, to be understood that all such variations, modifications and changes are believed to fall within the scope of the invention as defined in the appended claims.

What is claimed is:

1. A keyboard switch for transducing a mechanical depression force applied to a key member into electrical signals representing that key member, said switch comprising:

a housing;

an actuator member movable depressionally and elevationally in said housing in a first direction in response to depression and elevation, respectively, of said key member;

a snap action spring member which snaps between first and second stable positions generally along said first direction;

means linking said actuator member to said snap action spring member for snapping said snap action spring member from said first position to said second position in response to a predetermined depression of said actuator member from a rest position, and for snapping said spring member from said second position to said first position in response to a predetermined elevation position of said actuator;

a plurality of spaced piezoelectric transducer means for providing respective electrical signals when subjected to mechanical stress;

a common impact-receiving member secured to each of said transducer members for transmitting to said transducer members mechanical forces which are applied to said impact-receiving member;

support means positionally fixed in said housing and disposed in contact with each of said transducer members such that said transducer members are disposed between said support means and said impact-receiving means;

percussion applicator means secured to said snap action spring members such that said percussion applicator means forcefully percussively impacts directly against said impact-receiving member to mechanically stress said transducer members against said support means when said snap action spring member snaps from said first position to said second position; and return bias means for continuously urging said actuator in a direction to elevate said actuator member beyond said predetermined elevation and toward said rest position.

2. The keyboard switch according to claim 1 wherein said percussion applicator means is positioned so as to be continuously urged against said impact-receiving member when said snap action spring member is in said second position, thereby to continuously make electrical contact between said percussion applicator means and the impact-receiving member.

3. The keyboard switch according to claim 1 further comprising lost motion linkage means between said actuator member and said snap action spring member for permitting at least a small degree of elevational movement of said actuator member under the influence of said return bias means, without snapping said snap action spring member from said second position to said first position.

4. The keyboard switch according to claim 3 wherein said lost motion linkage means comprises:
an aperture defined through said snap action spring member along said first direction; and
an elongated pawl-like member secured to said actuator member and extending therefrom in the direction of depression of said actuator member, said pawl-like member including a flange portion which is larger than said aperture and disposed on the depression side of said snap action spring member;
wherein the pawl-like member is longitudinally slidable in said aperture to define said at least small degree of elevational movement.

5. The keyboard switch according to claim 1 wherein said snap action spring member comprises:
a substantially flat spring member disposed transversely of said first direction; and
a yoke spring member secured to said housing and having a pair of resiliently pivotal spaced arms directed generally in the direction of depression of said actuator member on opposite sides of said actuator member;
wherein said substantially flat spring member is secured to and supported between said spaced arms.

6. The keyboard switch according to claim 1 wherein said support means comprises a plurality of electrically conductive members, each being electrically coupled to a respective piezoelectric transducer member to receive respective electrical signals from said transducer members.

7. A keyboard assembly comprising a plurality of keyboard switches according to claim 1 wherein said support means comprises a plurality of electrically conductive data paths, wherein the number of data paths at least equals the number of piezoelectric transducer members in said keyboard switch, and further comprising electrical connection means connecting selected piezoelectric transducer members to respective data paths at each keyboard switch to define an array wherein a different combination of piezoelectric transducer members is connected to the data paths at each keyboard switch in order that actuation of each switch is uniquely represented by its own coded digital signal in said data paths.

8. A keyboard assembly comprising a plurality of keyboard switches as recited in claim 1 positionally arranged in an array of columns and rows, said assembly further comprising:
a plurality of spaced parallel electrically conductive tracks, comprising part of said support means in each of said plurality of keyboard switches, extending in respective generally serpentine paths which pass adjacent each switch, each track being in electrical contact with a respective transducer member at selected keyboard switches;
electrically insulative means disposed between preselected transducer members at each of said keyboard switches and their respective adjacent track such that a different combination of transducer members contacts the conductive tracks at each keyboard switch to define a unique combination of such contacts identifying that keyboard switch; and
circuit means connected to said tracks for detecting electrical signals applied thereto from said transducer members.

9. The keyboard assembly according to claim 8 wherein said electrically insulative means comprises an electrically insulative thin film mask disposed between said transducer members and said conductive tracks, said mask being interrupted to permit electrical contact between the conductive tracks and certain transducer members at each keyboard switch.

10. The keyboard assembly according to claim 8 wherein said conductive tracks are at least n in number, said assembly further comprising:
n resettable latch means, each connected to a respective conductive track to receive signals appearing on that track and provide a data signal representing the binary data of the received signals;
n clocked register means, each responsive to application of a gating signal thereto to enter the data provided by a respective latch means; and
timer means responsive to application of a trigger signal thereto for providing said gating signal after elapse of a first predetermined time interval following application of said trigger signal, and for providing a reset signal to reset each of said latch means after elapse of a second predetermined time interval following application of said trigger signal, said second predetermined time interval being longer than said first predetermined time interval.

11. The keyboard assembly according to claim 10 further comprising programmed means for converting data signals entered in said register means to a prescribed code and transmitting said code in serial binary form over a prescribed data path.

12. The keyboard assembly according to claim 11 further comprising:
a bus electrically contacting said percussion applicator means at selected keyboard switches in said array; and
means responsive to grounding said bus to an impact-receiving member by depression of any of said selected keyboard switches throughout at least a predetermined actuation interval for repetitively actuating said programmable means at prescribed intervals for as long as the selected keyboard swithch remains actuated.

13. The keyboard switch according to claim 2 further comprising lost motion linkage means between said actuator member and said snap action spring member for permitting at least a small degree of elevational movement of said actuator member under the influence of said return bias means, without snapping said snap action spring member from said second position to said first position.

14. The keyboard switch according to claim 13 wherein said support means comprises a plurality of electrically conductive members, each being electrically coupled to a respective piezoelectric transducer member to receive respective electrical signals from said transducer members.

15. The keyboard switch according to claim 1 wherein said linking means comprises a rigid yoke member secured to said housing and having first and second fixedly spaced arms, a swing arm having first and second opposite ends, first pivot means securing said swing arm to said actuator member about a first pivot axis extending perpendicular to said first dimension through a location on said swing arm intermediate said first and second ends, and second pivot means pivotally connecting said first end of said swing arm to said first arm of said yoke member about a second pivot axis extending parallel to said first pivot axis; and wherein said spring means comprises a generally curved strip of spring material having a first end connected to said second end of said swing arm, and having a second end connected to said second arm of said yoke member.

16. The keyboard switch according to claim 15 wherein said yoke member is a generally U-shaped member having crosspiece connecting said spaced arms, wherein said housing includes a panel having an underside, wherein said crosspiece is secured to the underside of said panel with said yoke arms extending generally perpendicularly away from said panel, and wherein said panel is apertured to permit selective movement of said actuator member through the panel.

17. The keyboard switch according to claim 16 wherein said crosspiece is provided with an aperture that is aligned with the aperture in said panel to permit selective movement of said actuator member through said crosspiece.

18. The keyboard switch according to claim 16 wherein said first arm of said yoke member is indented to define a generally V-shaped notch, and wherein said second pivot means comprises a knife edge configuration of said first end of said swing arm inserted into said notch.

19. In an electrical keyboard assembly of the type wherein individual keyboard switches in an array are selectively actuable to apply an n-bit binary number in parallel on n respective common data lines, a processing circuit for processing said n-bit binary numbers comprising:
n resettable latch means, each connected to a respective data line to receive signals appearing on that line and provide a data signal representing the binary state of the received signals;
n clocked register means, each responsive to application of a gating signal thereto for entering therein the data signal provided by a respective latch means; and
timer means responsive to application of a trigger signal thereto for providing said gating signal after elapse of a first predetermined time interval following application of said trigger signal, and for providing a reset signal to reset each of said latch means after elapse of a second predetermined time interval following application of said trigger signal, said second predetermined time interval being longer than said first predetermined time interval.

20. The keyboard assembly according to claim 19 further comprising programmable means for converting data signals entered in said register means to a prescribed code and transmitting said code in serial binary form over a prescribed data path.

21. The keyboard assembly according to claim 20 further comprising:
a further data line electrically contacting selected keyboard switches in said array; and
means responsive to actuation of each of said selected keyboard switches for at least a predetermined actuation interval for repetitively actuating said programmable means at prescribed intervals for as long as the selected keyboard switch remains actuated.

22. A keyboard switch for transducing a mechanical depression force applied to a key member into electrical signals representing that key member, said switch comprising;
a housing;
an actuator member movable depressionally and elevationally in said housing in a first direction in response to depression and elevation, respectively, of said key member;
a plurality of spaced piezoelectric transducer means for providing respective electrical signals when subjected to mechanical stress;
a common impact-receiving member secured to each of said transducer members for transmitting to said transducer members mechanical forces which are applied to said impact-receiving member;
support means positionally fixed in said housing and disposed in contact with each of said transducer members such that said transducer members are disposed between said support means and said impact-receiving means;
percussion applicator means actuable by said actuator member for forcefully impacting against said impact-receiving member to substantially equally mechanically stress said transducer members; and
an assembly comprising a plurality of said keyboard switches positionally arranged in an array of columns and rows, said assembly further comprising:
a plurality of spaced parallel electrically conductive tracks, comprising part of said suport means in each of said plurality of keyboard switches, extending in respective generally serpentine paths which pass adjacent each switch, each track being in electrical contact with a respective transducer member at selected keyboard switches;
electrically insulative means disposed between preselected transducer members at each of said keyboard switches and their respective adjacent track such that a different combination of transducer members contacts the conductive tracks at each keyboard switch to define a unique combination of such contacts identifying that keyboard switch; and
circuit means connected to said tracks for detecting electrical signals applied thereto from said transducer members.

23. The keyboard assembly according to claim 22 wherein said electrically insulative means comprises an electrically insulative thin film mask disposed between said transducer members and said conductive tracks, said mask being interrupted to permit electrical contact between the conductive tracks and certain transducer members at each keyboard switch.

24. The keyboard assembly according to claim 22 wherein said conductive tracks are at least n in number, said assembly further comprising:
   n resettable latch means, each connected to a respective conductive track to receive signals appearing on that track and provide a data signal representing the binary date of the received signals;
   n clocked register means, each responsive to application of a gating signal thereto to enter the data provided by a respective latch means; and
   timer means responsive to application of a trigger signal thereto for providing said gating signal after elapse of a first predetermined time interval following application of said trigger signal, and for providing a reset signal to reset each of said latch means after elapse of a second predetermined time interval following application of said trigger signal, said second predetermined time interval being longer than said first predetermined time interval.

25. A keyboard switch for transducing a mechanical depression force applied to a key member into electrical signals representing that key member, said switch comprising;
   a housing;
   an actuator member movable depressionally and elevationally in said housing in a first direction in response to depression and elevation, respectively, of said key member;
   a plurality of spaced piezoelectric transducer means for providing respective electrical signals when subjected to mechanical stress;
   a common impact-receiving member secured to each of said transducer members for transmitting to said transducer members mechanical forces which are applied to said impact-receiving member;
   support means positionally fixed in said housing and disposed in contact with each of said transducer members such that said transducer members are disposed between said support means and said impact-receiving means;
   percussion applicator means actuable by said actuator member for forcefully impacting against said impact-receiving member to substantially equally mechanically stress said transducer members; and
   wherein said support means comprises a plurality of electrically conductive members, each being electrically coupled to a respective piezoelectric transducer member to receive respective electrical signals from said transducer members.

* * * * *